(12) United States Patent
Lee et al.

(10) Patent No.: US 8,304,972 B2
(45) Date of Patent: Nov. 6, 2012

(54) COATING LAYER FOR BLOCKING EMI, OPTICAL FILTER INCLUDING THE SAME, AND DISPLAY APPARATUS INCLUDING THE SAME

(75) Inventors: Jang Hoon Lee, Gumi-si (KR); Je Choon Ryoo, Daegu (KR); Jeong Hong Oh, Gumi-si (KR); Eui Soo Kim, Daegu (KR); Jong Han Oh, Gumi-si (KR)

(73) Assignee: Samsung Corning Precision Materials Co., Ltd., Gyeongsangbuk-Do (KR)

( * ) Notice: Subject to any disclaimer, the term of this patent is extended or adjusted under 35 U.S.C. 154(b) by 365 days.

(21) Appl. No.: 11/808,446

(22) Filed: Jun. 11, 2007

(65) Prior Publication Data

US 2008/0012493 A1 Jan. 17, 2008

(30) Foreign Application Priority Data

Jul. 14, 2006 (KR) .................. 10-2006-0066603

(51) Int. Cl.
*F21V 9/04* (2006.01)
*F21V 9/06* (2006.01)
(52) U.S. Cl. .................. 313/112; 313/582; 359/360
(58) Field of Classification Search .................. 313/489, 313/112, 582–587; 359/558, 359–360
See application file for complete search history.

(56) References Cited

U.S. PATENT DOCUMENTS

| 6,252,703 | B1 * | 6/2001 | Nakamura et al. ............ 359/360 |
| 6,965,191 | B2 * | 11/2005 | Koike et al. .................... 313/112 |
| 2002/0086164 | A1 * | 7/2002 | Anzaki et al. ................. 428/432 |

FOREIGN PATENT DOCUMENTS

| JP | 2000-031687 | 1/2000 |
| JP | 2003-215304 | 7/2003 |
| KR | 10-2006-0034053 A | 4/2006 |

OTHER PUBLICATIONS

Korean Office Action issued in Korean Patent Application No. KR 10-2006-0066603 dated Aug. 25, 2009.

* cited by examiner

*Primary Examiner* — Nimeshkumar Patel
*Assistant Examiner* — Christopher Raabe
(74) *Attorney, Agent, or Firm* — McDermott Will & Emery LLP

(57) ABSTRACT

A coating layer for blocking EMI is disclosed, which comprises a base substrate, and a deposition member formed at one surface of the base substrate, comprising a plurality of repetitive unit films which include metal layers and high refraction layers, wherein any one of the outmost metal layers of the deposition member has a minimum thickness among the metal layers. Also, an optical filter which includes the coating layer and a display apparatus are disclosed.

21 Claims, 5 Drawing Sheets

COATING LAYER FOR BLOCKING EMI, OPTICAL FILTER INCLUDING THE SAME, AND DISPLAY APPARATUS INCLUDING THE SAME

CROSS-REFERENCE TO RELATED APPLICATIONS

This application claims priority from Korean Patent Application No. 10-2006-66603, filed on Jul. 14, 2006, in the Korean Intellectual Property Office, the entire disclosure of which is incorporated herein by reference.

BACKGROUND OF THE INVENTION

1. Field of the Invention

The present invention relates to a coating layer for blocking electromagnetic interference (EMI), an optical filter including the same, and a display apparatus including the same, and more particularly, to a coating layer for blocking EMI, an optical filter including the same, and a display apparatus including the same, in which excellent blocking efficiency of EMI can be obtained due to low surface resistance, and excellent regeneration can be obtained due to a low possibility of peeling.

2. Description of the Related Art

Generally, in a plasma display panel (PDP) device, a discharge is generated from a gas between electrodes by a direct current or an alternating current voltage applied to electrodes. A phosphor is excited by emission of ultraviolet rays accompanied with the discharge to emit light. Also, the PDP device has drawbacks in that a high emission rate of electromagnetic waves and near infrared rays is caused due to driving characteristics of the PDP device, surface reflection of a phosphor is high, and color purity does not reach a cathode ray tube due to orange light emitted from a sealing gas such as He or Xe.

Consequently, the electromagnetic waves and near infrared rays generated from the PDP device may adversely affect a human body and may cause malfunctions of sensitive equipment such as a wireless phone or a remote controller. To use such a PDP device, it is required that emission of the electromagnetic waves and near infrared rays emitted from the PDP device should be controlled to be at a predetermined value or less. To this end, a PDP filter is used, which has a blocking function of EMI, a blocking function of near infrared rays, antireflection function of light surface, and improvement function of color purity to block EMI and near infrared rays, reduce reflection light, and improve color purity. Accordingly, the PDP device includes a panel assembly and a PDP filter, wherein the panel assembly includes a discharge cell where gas discharge occurs, and the PDP filter blocks electromagnetic waves and near infrared rays.

Furthermore, the PDP filter should have transparency since it is fixed to a front portion of the panel assembly. Also, in the PDP device, a current flowing in a driving circuit and an alternating current electrode and a high voltage applied between electrodes for plasma discharge are main factors which generate electromagnetic waves. At this time, a main frequency area of the generated electromagnetic waves is in the range of 30 MHz to 200 MHz. A transparent conductive film or a conductive mesh is used as a blocking layer of EMI. In this case, the transparent conductive film or the conductive mesh maintains high transmissivity and low reflexibility to visible rays.

The blocking layer of EMI, which is formed of a conductive mesh, has excellent characteristics in blocking EMI. Indium tin oxide (ITO) is mainly used as a single layered conductive film. When the blocking layer of EMI is formed of a multilayered transparent conductive film of a precious metal thin film, the multilayered thin film is coated with a metal thin film and a high refraction transparent thin film alternately. At this time, Ag or an alloy which contains Ag as a main component is mainly used as the metal thin film.

The metal thin film of Ag, and the like, has excellent reflexibility characteristics when thin, but blocking efficiency of the EMI may become worse as surface resistance is reduced. A transparent conductive film structure which satisfies both reflexibility characteristics and blocking efficiency of EMI has not yet been provided.

SUMMARY OF THE INVENTION

An aspect of the present invention provides a coating layer for blocking electromagnetic interference (EMI), which has excellent blocking efficiency of EMI and suppresses an increase of reflexibility.

An aspect of the present invention also provides an optical filter for a display apparatus, which includes the coating layer for blocking EMI, and has excellent blocking efficiency of EMI and excellent optical characteristics.

An aspect of the present invention also provides a display apparatus which includes the coating layer for blocking EMI, and has excellent display quality.

According to an aspect of the present invention, there is provided a coating layer for blocking EMI, which comprises a base substrate, and a deposition member formed at one surface of the base substrate, and comprising a plurality of repetitive unit films which include metal layers and high refraction layers, wherein any one of the outmost metal layers of the deposition member has a minimum thickness among the metal layers.

The high refraction layers are made of $Nb_2O_5$, and the metal layers are made of Ag.

The repetitive unit films further include at least one metal oxide layer adhered near the metal layers. For example, the repetitive unit films include a first metal oxide layer and a second metal oxide layer which are adjacent to the metal layers.

The metal oxide layer is made of AZO.

The coating layer for blocking EMI comprises three to six repetitive unit films, and preferably four repetitive unit films.

Preferably, a total thickness of the metal layers within the repetitive unit films is in the range of 48 nm to 52 nm. The metal layer having the minimum thickness preferably has a thickness in the range of 8 nm to 12.5 nm.

Also, other metal layers except for the metal layer having the minimum thickness have the same thickness as each another.

According to another aspect of the present invention, there is provided an optical filter for a display apparatus, which comprises a base substrate, a deposition member for blocking EMI, formed at one surface of the base substrate, comprising a plurality of repetitive unit films which include metal layers and high refraction layers, any one of the outmost metal layers of the deposition member having a minimum thickness among the metal layers, a color film arranged near one surface of a coating layer, and an anti-reflection film arranged on the color film.

The base substrate includes a first surface and a second surface opposite to the first surface, the first surface is adhered on the color film, a black ceramic is formed in an edge area of the second surface, and the deposition member is formed on the second surface.

The base substrate, the color film, and the anti-reflection film are adhered to one another by a PSA.

The optical filter for the display apparatus further comprises a protective film formed on the coating layer to protect the coating layer.

The protective film is formed on the coating layer to partially expose the edge area.

A conductive paste is formed on the black ceramic.

The base substrate is made of a semi-tempered glass or a transparent high polymer resin.

Alternatively, the base substrate includes a first surface and a second surface opposite to the first surface, the coating layer is formed on the first surface, the coating layer is adhered to the color film, and a black ceramic is formed in an edge area of the second surface.

The base substrate and a side portion of the color film are surrounded by a conductive tape.

According to other aspect of the present invention, there is provided a display apparatus which includes a display panel converting an electric signal into an image signal when a power source is applied to the display apparatus, displaying an image and an optical filter being arranged on one surface of the display panel, the optical filter facing the display panel and comprising a base substrate, a deposition member for blocking EMI, formed at one surface of the base substrate, comprising a plurality of repetitive unit films which include metal layers and high refraction layers, any one of the outmost metal layers of the deposition member having a minimum thickness among the metal layers, a color film arranged near a coating layer, and an anti-reflection film arranged on the color film.

BRIEF DESCRIPTION OF THE DRAWINGS

The above and/or other aspects of the present invention will become apparent and more readily appreciated from the following detailed description, taken in conjunction with the accompanying drawings of which.

DETAILED DESCRIPTION OF THE INVENTION

Figure 1:
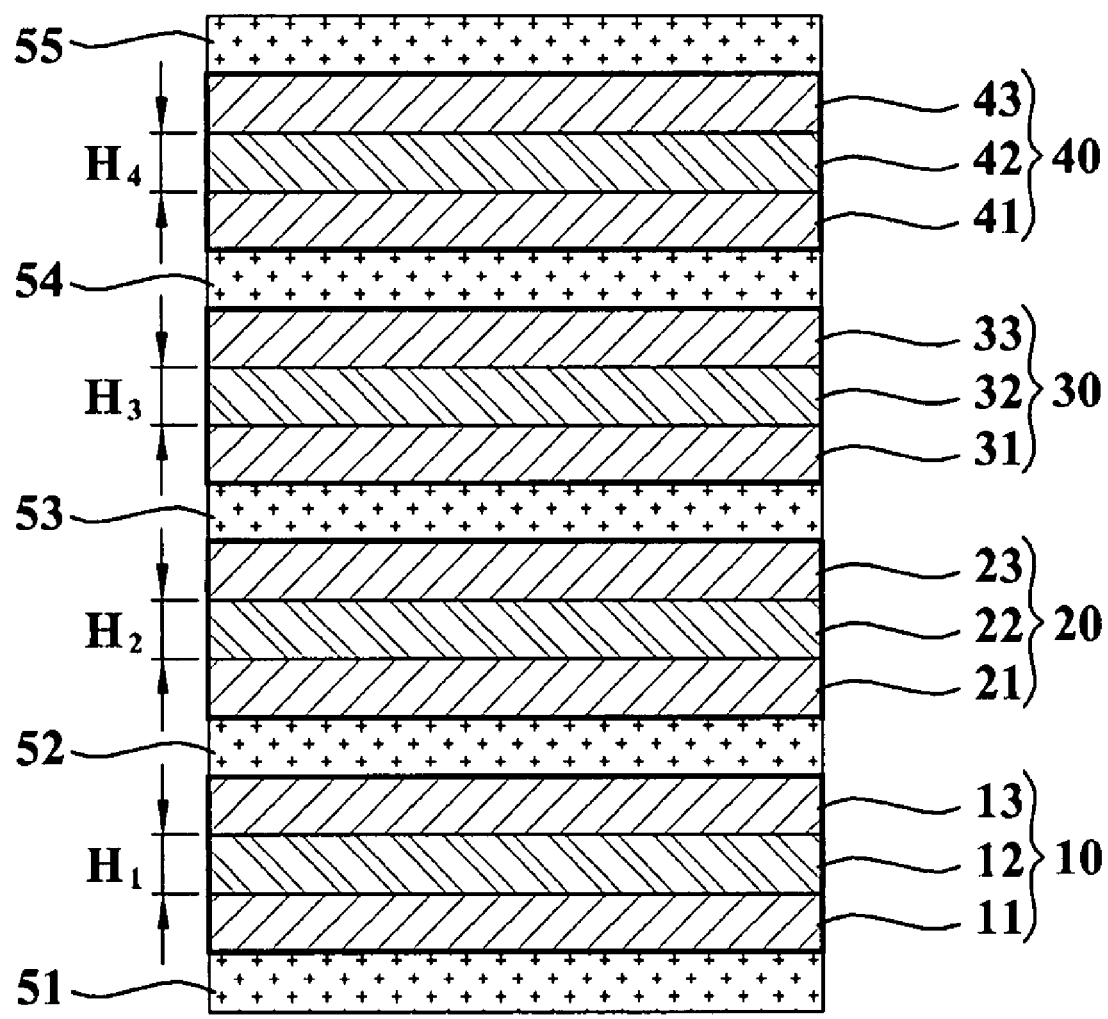
FIG. 1 is a cross-sectional view illustrating a coating layer for blocking EMI according to an exemplary embodiment of the present invention.

Reference will now be made in detail to exemplary embodiments of the present invention, examples of which are illustrated in the accompanying drawings, wherein like reference numerals refer to the like elements throughout. The exemplary embodiments are described below in order to explain the present invention by referring to the figures.

FIG. 1 is a cross-sectional view illustrating a coating layer for blocking EMI according to an exemplary embodiment of the present invention.

Referring to FIG. 1, the coating layer for blocking EMI includes a plurality of repetitive unit films 10, 20, 30, 40 comprised of first metal oxide layers 11, 21, 31, 41, metal layers 12, 22, 32, 42, and second metal oxide layers 13, 23, 33, 43, which are sequentially deposited. In the present exemplary embodiment, the coating layer for blocking EMI includes four repetitive unit films 10, 20, 30, 40. Also, the coating layer for blocking EMI according to the present invention may include a various number of repetitive unit films 10, 20, 30, 40 more than two.

In the present exemplary embodiment, the first metal oxide layers 11, 21, 31, 41 and the second metal oxide layers 13, 23, 33, 43 are made of aluminum doped zinc oxide (AZO). Also, Ag is used as the metal layers 12, 22, 32, 42.

The repetitive unit films 10, 20, 30, 40 can be divided into the first and fourth repetitive unit films 10, 40 disposed in the outmost layer of the coating layer and the second and third repetitive unit films 20, 30 disposed between the first repetitive unit film 10 and the fourth repetitive unit film.

A first high refraction layer 51 is formed outside the first repetitive unit film 10, and a fifth high refraction layer 55 is formed outside the fourth repetitive unit film 40. A second high refraction layer 52 is formed between the first repetitive unit film 10 and the second repetitive unit film 20, and a third high refraction layer 53 is formed between the second repetitive unit film 20 and the third repetitive unit film 30. A fourth high refraction layer 54 is formed between the third repetitive unit film 30 and the fourth repetitive unit film 40.

In this exemplary embodiment, the first to fifth high refraction layers 51, 52, 53, 54, 55 are made of $Nb_2O_5$.

The first to fourth repetitive unit films 10, 20, 30, 40 respectively include the first to fourth metal layers 12, 22, 32, 42. In the present exemplary embodiment, the metal layer 12 or 42 included in any one of the first and fourth repetitive unit films 10, 40 which are the outmost repetitive unit films, has a minimum thickness $H_1$ among all the metal layers 12, 22, 32, 42.

In this exemplary embodiment, the first metal layer 12 of the first repetitive unit film 10 has a minimum thickness $H_1$. The deposition member is formed on one surface of a base substrate, which will be described later, to form a single coating layer along with the base substrate. In this case, the deposition member is coated so that the first high refraction layer 51 formed outside of the first repetitive unit film 10 which includes the first metal layer 12 having the minimum thickness $H_1$ abuts the one surface of the base substrate. Specifically, the deposition member is coated on the base substrate so that the first metal layer 12 having the minimum thickness $H_1$ becomes adjacent to the base substrate.

In the repetitive unit films 10, 20, 30, 40 according to the present invention, the first repetitive unit film 10, for example, includes two metal oxide films 11, 13. Specifically, since the first and second metal oxide layers 11, 13 are inserted to both sides of the first metal layer 12, an adhesive force of the deposition member can be improved. In the case of no second metal oxide layer 13, the first metal layer 12 is directly adhered to the second high refraction layer 52. In this case, it is likely that peeling may occur between the first metal layer 12 and the second high refraction layer 52 due to a weak adhesive force when the deposition member for blocking EMI is removed. For this reason, removal efficiency may be deteriorated when the deposition member for blocking EMI is removed. However, the adhesive force between the first metal layer 12 and the second high refraction layer 52 is reinforced due to insertion of the second metal oxide film 13. Moreover, the deposition member for blocking EMI can easily be removed. Specifically, the second metal oxide film 13 serves as an adhesion reinforcing layer.

Also, the second metal oxide film 13 serves to prevent the first metal layer 12 from being oxidized.

When the thickness $H_1$ of the first metal layer 12 designed to have the minimum thickness is less than 8 nm, a problem occurs in that blocking efficiency of EMI may be deteriorated as metal characteristics are not exerted. By contrast, when the thickness $H_1$ of the first metal layer 12 exceeds 12.5 nm, a problem occurs in that light transmissivity of the deposition member may be deteriorated. Accordingly, the thickness $H_1$ of the first metal layer 12 is in the range of 8 nm to 12.5 nm, preferably in the range of 9 nm to 12 nm. Specifically, the deposition member for blocking EMI has a structure of a single metal layer with a thickness of less than 12.5 nm.

Also, considering the light transmissivity, the total thickness $(H_1+H_2+H_3+H_4)$ of the first to fourth metal layers 12, 22, 32, 42 is preferably in the range of 48 nm to 52 nm.

As described above, when the thickness $H_1$ of the nearest metal layer 12 of the base substrate is designed to be smaller than the thickness of the other metal layers 22, 32, 42, 52, blocking efficiency of EMI can be improved and surface resistance can be reduced. At the same time, increase of reflexibility of an optical filter to which the deposition member is applied can be minimized to improve optical characteristics of the optical filter. Preferably, the second to fourth metal layers 22, 32, 42 except for the first metal layer 12 have the same thickness as one another.

Figure 2:
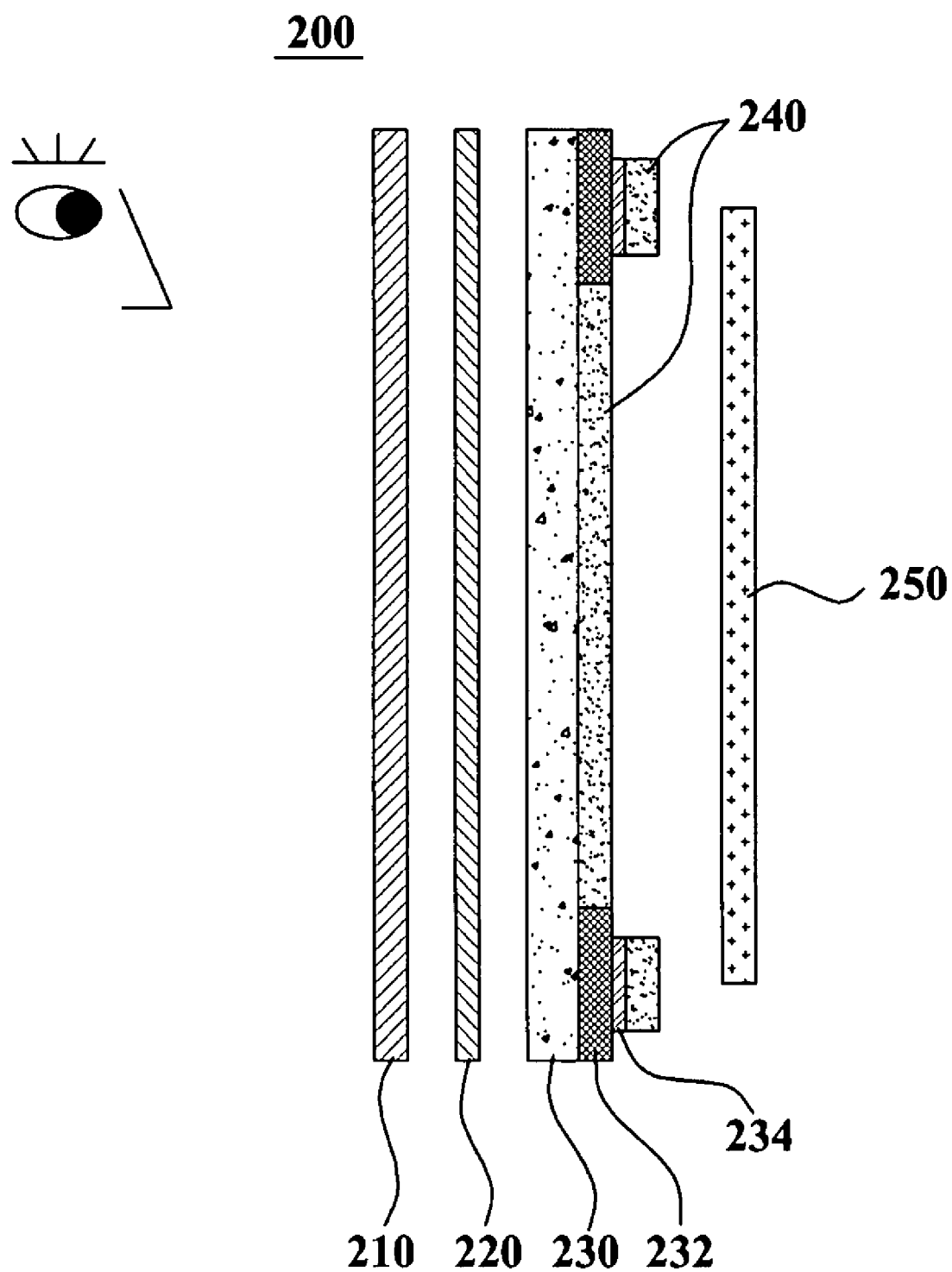
FIG. 2 is a view schematically illustrating an optical filter for a display apparatus according to an exemplary embodiment of the present invention.

FIG. 2 is a view schematically illustrating an optical filter for a display apparatus according to an exemplary embodiment of the present invention. Since a deposition member for blocking EMI shown in FIG. 2 is substantially the same as that of FIG. 1, repeated descriptions will be omitted.

Referring to FIG. 2, an optical filter 200 for a display apparatus includes an anti-reflection film (AR film) 210, a color film 220, a base substrate 230 provided with a deposition member 240 for blocking EMI, and a protective film 250. The base substrate 230 and the deposition member 240 are bonded to each other to form a coating layer.

The anti-reflection film 210 is arranged toward a viewer when applied to the display apparatus. The anti-reflection film 210 prevents an outer light source from being reflected, so as to prevent display quality of the display apparatus from being deteriorated.

The color film 220 is bonded onto the anti-reflection film 210 by a pressure sensitive adhesive (PSA).

The base substrate 230 is bonded to a rear surface of the color film 220 around the viewer by the PSA. A transparent high polymer resin such as semi-tempered glass, polycarbonate (PC), or polyethylenetelephthalate (PET) can be used as the base substrate 230. In this exemplary embodiment, the semi-tempered glass is used as the base substrate 230.

A black ceramic 232 is printed in an edge area of the base substrate 230. The black ceramic 232 corresponds to a portion displayed as black when viewed from a viewer and blocks images output from a display panel (not shown) of the display apparatus.

A conductive paste such as a silver paste 234 is formed on the black ceramic 232. The silver paste 234 is electrically grounded and thus serves as an outlet which externally emits electricity generated from the optical filter 200.

The deposition member 240 for blocking EMI is formed on the base substrate 230 including the black ceramic 232. The deposition member 240 for blocking EMI is formed on the base substrate 230 so that the repetitive unit film which includes the metal layer 12 or 42 having a minimum thickness becomes adjacent to the base substrate 230. Unlike this, the repetitive unit film which includes the metal layer 12 or 42 having the minimum thickness may be formed on the base substrate 230. Also, the deposition member 240 for blocking EMI is formed on the rear surface of the base substrate 230 around the viewer.

Referring to FIG. 1 again, the deposition member 230 for blocking EMI is formed on the base substrate 230 so that the first high refraction layer 51 of the deposition member 240 for blocking EMI abuts the base substrate 230.

The protective film 250 is bonded to the deposition member 240 for blocking EMI by the PSA to prevent the deposition member 240 for blocking EMI from being oxidized and being adhered with impurities. The protective film 250 is smaller than the deposition member 240 for blocking EMI to partially expose the edge area of the base substrate 230. Accordingly, an area where the silver paste 234 can be externally grounded can be prepared.

The PSA that can be used in the present invention has a refractive index of 1.4 to 1.7.

Since the deposition member 240 of the optical filter 200 for the display apparatus has a thin metal layer of less than 12.5 nm, blocking efficiency of EMI is excellent and surface resistance is low. Conversely, since the metal layer having the minimum thickness is designed to be nearest to or to be furthest away from the base substrate 230, an increase of reflexibility of the optical filter 200 can be minimized.

Generally, since a thin Ag layer of less than 12.5 nm is structurally incomplete due to air holes, charge mobility may be reduced, thereby increasing surface resistance of the coating layer for blocking EMI and deteriorating blocking efficiency of EMI. However, the thin thickness of the Ag layer is advantageous in view of reflexibility. Conversely, the two outmost metal layers are thinner than the other metal layers, the two outmost metal layers are more advantageous in view of reflexibility (reflexibility is reduced) but they are disadvantageous in view of surface resistance when their total thickness is the same as those of the other metal layers as the number of the thin Ag layers increases. Accordingly, in the present invention, increase of reflexibility due to a single thin metal layer can be minimized and at the same time decrease of blocking efficiency of EMI and increase of surface resistance can be suppressed.

Figure 3:
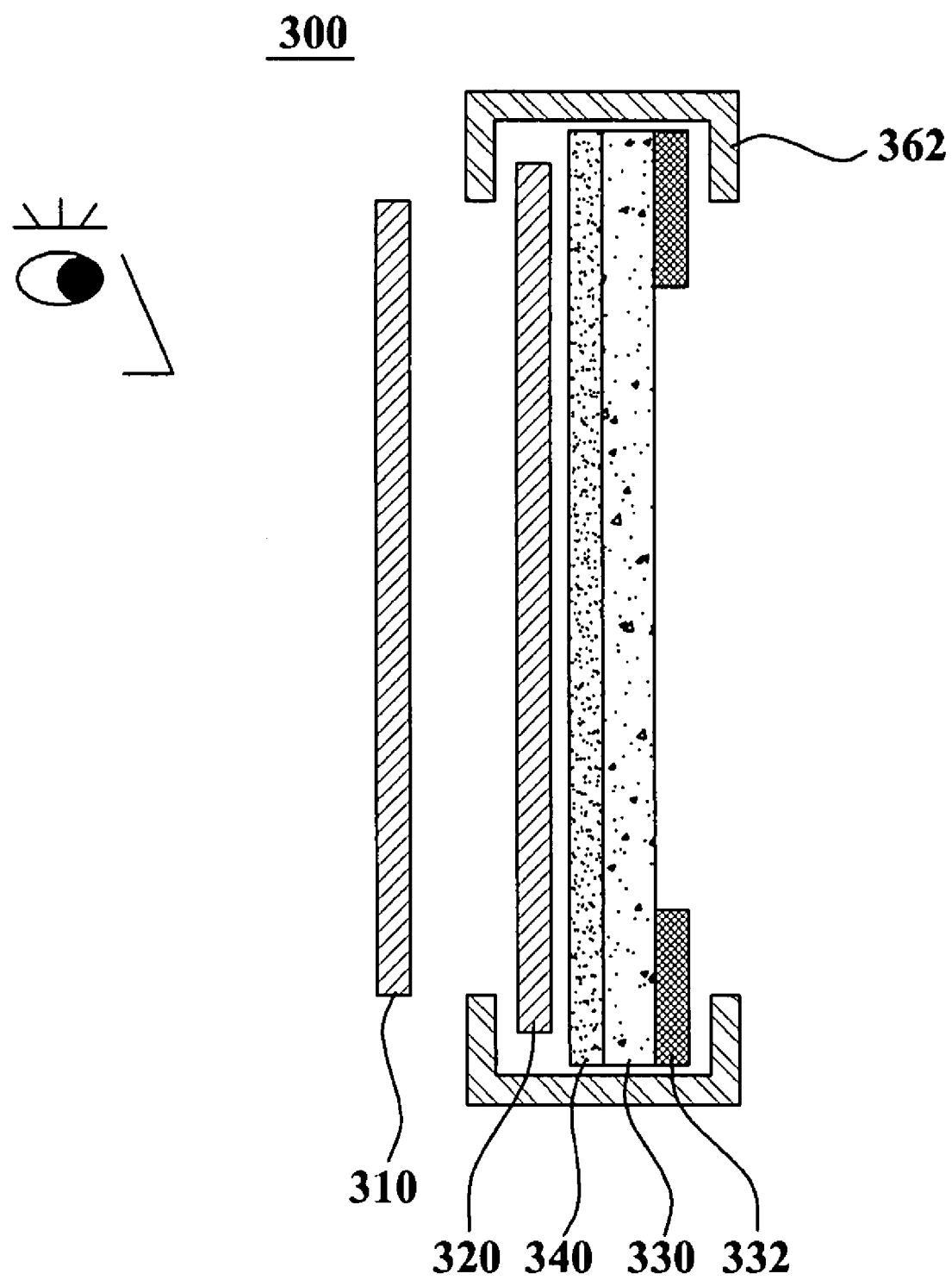
FIG. 3 is a view schematically illustrating an optical filter for a display apparatus according to another exemplary embodiment of the present invention.

FIG. 3 is a view schematically illustrating an optical filter for a display apparatus according to another exemplary embodiment of the present invention. Since a deposition member for blocking EMI shown in FIG. 3 is substantially the same as that of FIG. 1, repeated descriptions will be omitted. Also, the repeated description of the same elements as those of FIG. 2 will be omitted.

Referring to FIG. 3, an optical filter 300 for a display apparatus includes an anti-reflection film 310, a color film 320, and a base substrate 330 provided with a deposition member 340 for blocking EMI. The deposition member 340 for blocking EMI is formed on the base substrate 330 which faces the color film 320, and is bonded to the color film 320 by a PSA.

A black ceramic 332 is printed in an edge area of the base substrate 330.

The deposition member 340 for blocking EMI is formed on the base substrate 330 so that the repetitive unit film which includes the metal layer 12 or 42 having a minimum thickness becomes adjacent to the base substrate 330.

Referring to FIG. 1 again, the deposition member 340 for blocking EMI is formed on the base substrate 330 so that the first high refraction layer 51 of the deposition member 340 for blocking EMI abuts the base substrate 330.

In the present exemplary embodiment, since the deposition member 340 for blocking EMI is not exposed, the optical filter 300 may not include a protective film.

The base substrate 330 provided with the deposition member 340 for blocking EMI and a side portion of the color film 320 are surrounded by a conductive tape 362 such as a copper tape. The conductive tape 363 serves as an outlet which outwardly emits electricity generated from the optical filter 300.

Although some embodiments of the present invention have been described in FIGS. 2 and 3, when a bonding order of the anti-reflection film, the color film, and the base substrate provided with the deposition member is maintained, various modifications can be made in types and structures of other elements.

Hereinafter, results of various experiments for illustrating performance of the optical filter according to the present invention will be described.

Evaluation of Reflection Characteristics

Reflexibility of the optical filter which is a finished product and increase of reflexibility before and after adhesion of the PSA to the deposition member were analyzed on the target of the optical filter of FIG. 2 in which the anti-reflection film, the color film, the base substrate, the deposition member for blocking EMI and the protective film are sequentially deposited.

This analysis was made while changing the thickness of the metal layers of the deposition member for blocking EMI, and as a result, a thickness combination advantageous for deterioration of reflexibility was obtained.

A semi-tempered glass was used as the base substrate, and Ag was used as the metal layer of the deposition member for blocking EMI.

Detailed experiment requirements are as follows, and the results of the experiment are shown in Table 1 below.

1. Bonding structure of filter which is a finished product: [AR film/color film/semi-tempered glass/deposition member/protective film]
2. Average transmissivity of visual sense of color film: 45%
3. Reflexibility of visual sense of AR film: 1.1%
4. Refractive index of PSA: 1.47 (550 nm)/considering deviation value by wavelength in the case of calculation of reflxeibility.
5. Refractive index of semi-tempered glass: 1.47 (550 nm)/considering deviation value by wavelength in the case of calculation of reflxeibility.
6. Calculation value calculating tool: design of multilayered coating layer and simulation program (Essential Macleod version 8.2, manufactured by Thin-Film Center of USA)
7. Increase of reflexibility after adhesion of PSA: PSA adhesion coating glass reflexibility—coating glass reflexibility

TABLE 1

| | Arrangement | | Reflexibility (%) of filter finished product | | Increase (%) of reflexibility after PSA adhesion | |
|---|---|---|---|---|---|---|
| Structure | of Ag thickness (nm) | Ratio of Ag thickness | Calculation value | Measurement value | Calculation value | Measurement value |
| A | 12.5-12.5-12.5-12.5/glass | 1.0:1.0:1.0:1.0 | 2.8 | 2.7 | 1.8 | 1.6 |
| B | 11.7-14.0-11.7-11.7/glass | 1.0:1.2:1.0:1.0 | 2.7 | — | 2.8 | — |
| C | 11.7-11.7-14.0-11.7/glass | 1.0:1.0:1.2:1.0 | 2.8 | — | 2.6 | — |
| D | 14.0-11.7-11.7-11.7/glass | 1.2:1.0:1.0:1.0 | 4.0 | — | 5.1 | — |
| E | 11.7-11.7-11.7-14.0/glass | 1.0:1.0:1.0:1.2 | 3.7 | — | 5.0 | — |
| F | 10.7-11.7-12.8-13.8/glass | 1.0:1.1:1.2:1.3 | 3.1 | — | 1.2 | — |
| G | 13.8-12.8-11.7-10.7/glass | 1.3:1.2:1.1:1.0 | 2.8 | 3.2 | 4.1 | 3.7 |
| H | 13.1-12.5-12.0-11.4/glass | 1.15:1.1:1.05:1.0 | 2.7 | — | 3.5 | — |
| I | 12.8-12.8-12.8-10.7/glass | 1.2:1.2:1.2:1.0 | 2.5 | 2.4 | 2.8 | 3.2 |
| J | 10.7-12.8-12.8-12.8/glass | 1.0:1.2:1.2:1.2 | 2.6 | — | 0.2 | — |
| K | 12.8-10.7-12.8-12.8/glass | 1.2:1.0:1.2:1.2 | 3.4 | — | 4.7 | — |
| L | 12.8-12.8-10.7-12.8/glass | 1.2:1.2:1.0:1.2 | 3.3 | — | 2.7 | — |

As shown in Table 1, in the case of the filter finished product, it was evaluated for the calculation value and the measurement value that the structure "I" by the deposition member adhered with PSA has the lowest increase of reflexibility. Also, it was evaluated that the structure "J" has very low increase of reflexibility. Specifically, it was noted that the Ag layer nearest to or furthest away from the glass had the least thickness, and increase of reflexibility of the filter finished product was the smallest when the other Ag layers had the same thickness as one another. However, in the case of the structure "I," it was noted that the increase width of reflexibility was relatively great after the PSA had been adhered to the deposition member. However, in the optical filter according to the present invention, since the deposition member is disposed at the rear of the color film around the viewer, external incident light partially transmits the color film, reflects at a boundary surface between the PSA and the deposition member, and the reflected light is partially filtered by the color film. Accordingly, an increase of reflexibility at the boundary surface between the PSA and the deposition member is slight. For example, it is assumed that reflexibility of 5% was increased at the boundary surface between the PSA and the deposition member, an increase of reflexibility of the filter finished product substantially corresponds to [0.45× 0.45×0.05=0.01] and thus is only 1%. Specifically, increase of reflexibility can be suppressed by the structural feature of the present invention. By contrast, when the color film is disposed at the rear of the deposition member around the viewer unlike the present invention, an increase of reflexibility of 5% is reflected as is.

Accordingly, the optical filter according to the present invention can minimize an increase of reflexibility at the boundary surface between the PSA and the deposition member by the position relation between the color film and the deposition member as well as the intended position requirements of the metal layer having the minimum thickness.

Evaluation of Surface Resistance

Surface resistance was measured, using a non-contact surface resistance measuring instrument by NAGY of Germany, respectively for a deposition member for blocking EMI according to a comparable example, which was evaluated to have excellent deterioration characteristics of reflexibility, and the deposition member for blocking EMI according to the exemplary embodiment of the present invention.

Detailed thickness requirements of the metal layer (Ag) of the deposition members according to the comparable example and the exemplary embodiment of the present invention are as follows.

1. Comparable example: [11.3/13.5/13.5/11.3/glass]

2. Exemplary embodiment: [12.8/12.8/12.8/10.7/glass]

The result of surface resistance which was measured is shown in Table 2 below.

TABLE 2

| Surface resistance (Ω/□) | Comparable example | Exemplary embodiment | Difference |
|---|---|---|---|
| Measurement 1 | 1.030 | 0.946 | — |
| Measurement 2 | 0.983 | 0.906 | — |
| Average value | 1.007 | 0.926 | 0.081(~0.1) |

As shown in Table 2, surface resistance of the deposition member according to the present invention was relatively low. Accordingly, it was noted that blocking efficiency of EMI of the deposition member according to the present invention was more excellent than that of the deposition member according to the comparable example.

Evaluation of Peeling Characteristics

Peeling characteristics were evaluated for the deposition member (comparable example) for blocking EMI, which includes a first metal oxide layer only within a repetitive unit film, and the deposition member (exemplary embodiment) for blocking EMI, which includes a first metal oxide layer and a second metaloxide layer at both sides of a metal layer. AZO was used as the metal oxide layer in both the comparable example and the exemplary embodiment.

To evaluate the peeling characteristics, a product provided with a film having a strength of 10~15 N/25 mm adhered on the deposition member by the PSA was pressurized at a pressure of 7 kgf/cm$^2$ and 14 kgf/cm$^2$ in an auto clave to remove bubbles generated by step difference between the black ceramic and the adhesive film. Then, the product was exposed to external air for 8 hours. The above steps were repeated several times to find products having a defect of the adhesive film. 24 products having such a defect of the adhesive film were collected respectively for the comparable example and the exemplary embodiment to perform carry out each experiment. The defective films were removed using regeneration equipment and the number of peeling times of the deposition member was measured. The measured result is shown in Table 3 below.

TABLE 3

| | List | | | | |
|---|---|---|---|---|---|
| Target | Second metal oxide layer (AZO) Yes/No | Re-generation sample | The number of peelings | Compression condition | Success ratio (%) of regeneration |
| Comparable example | No | 24 | 2 | 7 | 91.7% |
| Exemplary embodiment | Yes | 24 | 0 | 7 | 100.0% |
| Comparable example | No | 24 | 22 | 14 | 8.3% |
| Exemplary embodiment | Yes | 24 | 2 | 14 | 91.7% |

As shown in Table 3, in the case of the comparable example, the product which the deposition member was peeled off was generated under all the compression conditions. However, in the case of the exemplary embodiment, the product which the deposition member was peeled off was not generated under the compression condition of 7 kgf/cm$^2$, and a ratio of the product which the deposition member was peeled off was generated at about 8.3% under the compression condition of 14 kgf/cm$^2$. Accordingly, since peeling rarely occurs in the deposition member according to the present invention, the deposition member according to the present invention has excellent regeneration characteristics.

Hereinafter, a display apparatus which includes the optical filter for the display apparatus of FIGS. 2 and 3 will be described.

Figure 4:
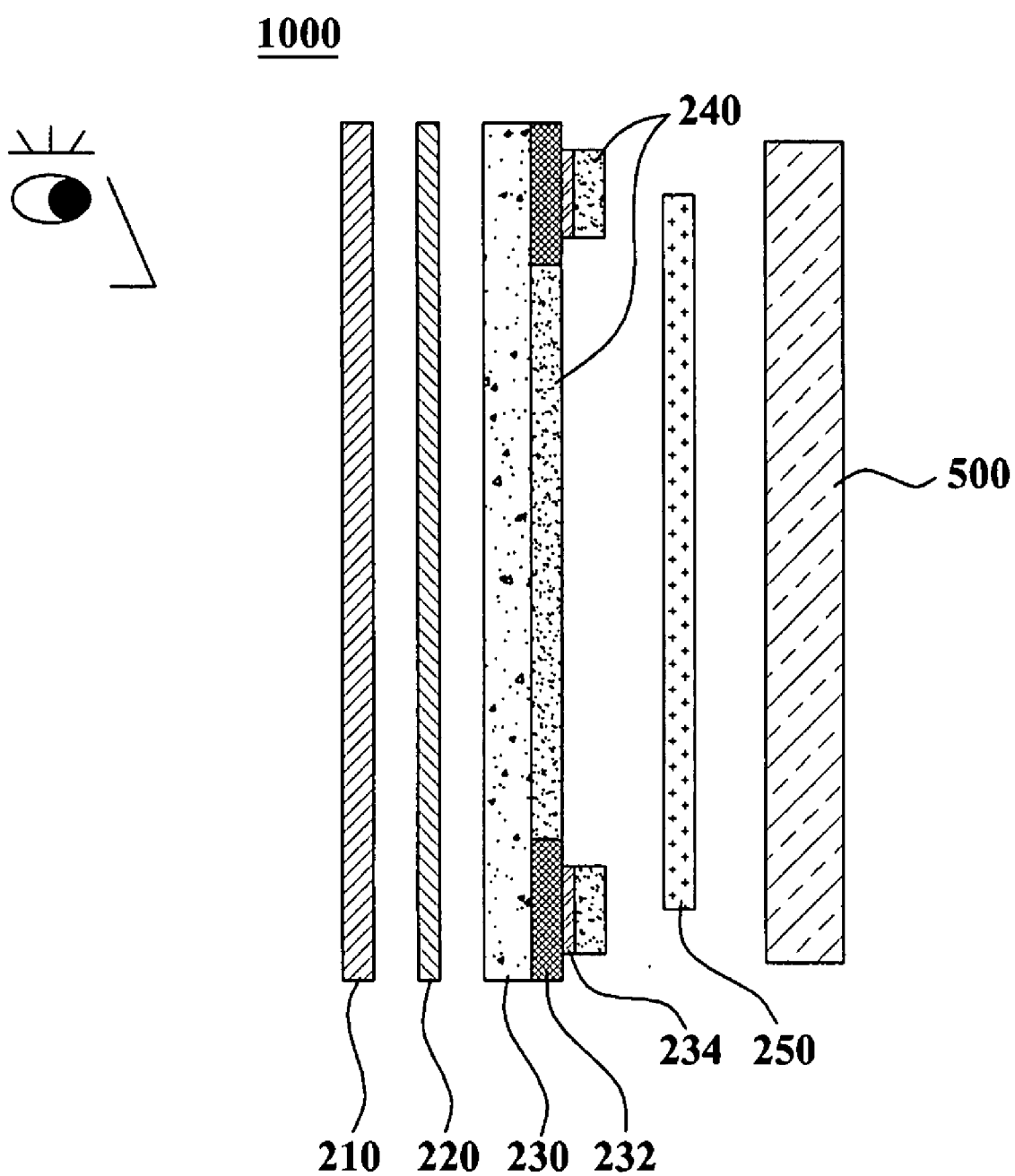
FIG. 4 is a view schematically illustrating a display apparatus which includes an optical filter for the display apparatus of FIG. 2.

FIG. 4 is a view schematically illustrating the display apparatus according to an exemplary embodiment of the present invention. Since the optical filter for the display apparatus of FIG. 2, which is included in the display apparatus of FIG. 4, has been described with reference to FIG. 2, repeated descriptions will be omitted.

Referring to FIG. 4, a display apparatus 1000 includes the optical filter 200 for the display apparatus of FIG. 2 and a display panel 500.

The display panel 500 is arranged on a surface opposite to the viewer around the optical filter 200. The display panel 500 is externally supplied with a power source and converts an electric signal into an image signal to display the image and emits the image to the optical filter 200. Since the color film 220 of the display apparatus 1000 is arranged nearer to the viewer than the deposition member 240, an increase of reflexibility generated at the boundary surface between the deposition member 240 and the PSA adhered to the deposition member can be suppressed. Specifically, unlike the structure where the color film 220 is nearer to the display panel 500 than the deposition member 240, the display apparatus 1000 of the present invention can suppress increase of reflexibility generated at the boundary surface between the deposition member 240 and the PSA as the external light source moves to the color film 220, the boundary surface between the deposition member 240 and the PSA, and the color film 220, as described in the evaluation of reflection characteristics.

Figure 5:
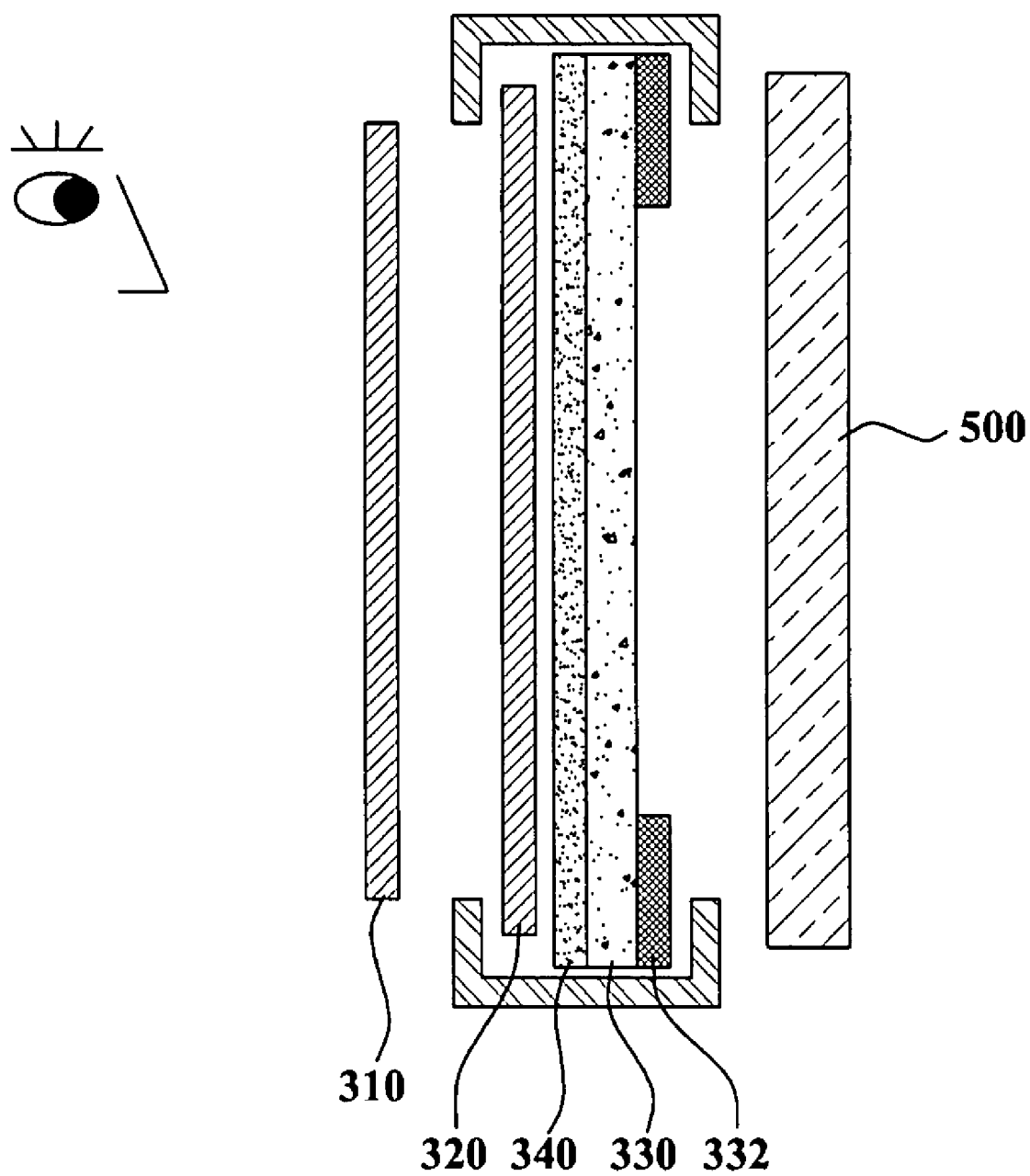
FIG. 5 is a view schematically illustrating a display apparatus which includes an optical filter for the display apparatus of FIG. 3.

FIG. 5 is a view schematically illustrating a display apparatus according to another exemplary embodiment of the present invention. The display apparatus of FIG. 5 includes the optical filter for the display apparatus of FIG. 3. Accordingly, since the optical filter for the display apparatus has been described above, repeated descriptions will be omitted.

Referring to FIG. 5, a display apparatus 110 includes the optical filter 300 for the display apparatus, and the display panel 500.

In the display apparatus 1000, the anti-reflection film 310, the color film 320, the deposition member 340 for blocking EMI, the base substrate 330, and the display panel 500 are sequentially arranged from the viewer. The deposition member 340 and the base substrate 330 are bonded to each other to constitute a coating layer.

An increase of reflexibility can be suppressed in the same manner as the display apparatus 1000 of FIG. 4 described above.

The coating layer for blocking EMI according to the present invention is especially applied to a plasma display device to exert excellent performance.

As described above, the deposition member for blocking EMI according to the present invention includes a single metal layer having a minimum thickness less than 12.5 nm within a repetitive unit film to improve blocking efficiency of EMI and reduce surface resistance, thereby improving performance of the optical filter which includes the deposition member according to the present invention. Conversely, the position conditions of the metal layer having the minimum thickness are provided so that an increase of reflexibility at the boundary surface between the deposition member and the PSA can be suppressed, thereby solving a reflexibility problem as a thin metal layer is only used, and improving reflexibility characteristics of the finished optical filter.

Furthermore, since the deposition member for blocking EMI according to the present invention includes two metal oxide layers at both sides of the metal layer within a repetitive unit, an adhesive force of the deposition member can be reinforced. For this reason, the probability of peeling can be reduced to improve regeneration when the deposition member is replaced with another deposition member.

Finally, since the optical filter according to the present invention provides a structure where the color film is arranged near the viewer, deterioration characteristics of reflexibility of the optical filter can be suppressed. Moreover, since the display apparatus according to the present invention includes the deposition member, surface resistance of the optical filter is reduced to improve blocking efficiency of EMI, thereby obtaining excellent image display quality of the display apparatus.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. An optical filter for a display apparatus comprising:
    a base substrate; and
    a deposition member for blocking electromagnetic interference (EMI), formed at one surface of the base substrate, and comprising high refraction layers and a plurality of repetitive unit films each repetitive unit film including a metal layer,
    wherein two of the plurality of repetitive unit films each form outmost unit films on opposite ends of the deposition member, the metal layer of each of the outmost unit films is an outmost metal layer, one of the outmost metal layers has a minimum thickness among the metal layers, and
    the other metal layers except for the metal layer having the minimum thickness have the same thickness as one another, the same thickness being different from the minimum thickness, and
    wherein the optical filter has no other repetitive unit film outside the deposition member.

2. The optical for a display apparatus of claim 1, wherein the outmost metal layer adjacent to the base substrate among the outmost metal layers of the deposition member has the minimum thickness among the metal layers.

3. The optical for a display apparatus of claim 1, wherein the high refraction layers are made of $Nb_2O_5$.

4. The optical for a display apparatus of claim 1, wherein the metal layers are made of Ag.

5. The optical for a display apparatus of claim 1, wherein the repetitive unit films further include at least one metal oxide layer formed near the metal layers.

6. The optical for a display apparatus of claim 5, wherein the repetitive unit films include a first metal oxide layer and a second metal oxide layer which are adjacent to the metal layers.

7. The optical for a display apparatus of claim 5, wherein the at least one metal oxide layer is made of AZO.

8. The optical for a display apparatus of claim 1, comprising three to six repetitive unit films.

9. The optical for a display apparatus of claim 8, comprising four repetitive unit films.

10. The optical for a display apparatus of claim 9, wherein a total thickness of the metal layers within the repetitive unit films is in the range of 48 nm to 52 nm.

11. The optical for a display apparatus of claim 1, wherein the metal layer having the minimum thickness has a thickness in the range of 8 nm to 12.5 nm.

12. The optical filter for a display apparatus of claim 1, further comprising:
    a color film arranged near the base substrate or the deposition member; and
    an anti-reflection film arranged on the color film.

13. The optical filter for the display apparatus of claim 12, wherein the base substrate includes a first surface and a second surface opposite to the first surface, the first surface is adhered on the color film, a black ceramic is formed in an edge area of the second surface, and the deposition member is formed on the second surface.

14. The optical filter for the display apparatus of claim 13, wherein the base substrate, the color film, and the anti-reflection film are adhered to one another by a PSA.

15. The optical filter for the display apparatus of claim 1, further comprising a protective film formed on the deposition member to protect the deposition member.

16. The optical filter for the display apparatus of claim 15, wherein the protective film is formed on the deposition member to partially expose an edge area of the deposition member.

17. The optical filter for the display apparatus of claim 13, wherein a conductive paste is formed on the black ceramic.

18. The optical filter for the display apparatus of claim 1, wherein the base substrate is made of a semi-tempered glass or a transparent high polymer resin.

19. The optical filter for the display apparatus of claim 12, wherein the base substrate includes a first surface and a second surface opposite to the first surface, the deposition member is formed on the first surface, the deposition member is adhered to the color film, and a black ceramic is formed in an edge area of the second surface.

20. The optical filter for the display apparatus of claim 19, wherein the base substrate and a side portion of the color film are surrounded by a conductive tape.

21. A display apparatus which includes a display panel converting an electric signal into an image signal when a power source is applied to the display apparatus, displaying an image, and an optical filter being arranged on one surface of the display panel, the optical filter facing the display panel and comprising:

a base substrate, and a deposition member for blocking EMI, formed at one surface of the base substrate, comprising high refraction layers and a plurality of repetitive unit films each repetitive unit film including a metal layer, wherein two of the plurality of repetitive unit films each form outmost unit films on opposite ends of the deposition member, the metal layer of each of the outmost unit films is an outmost metal layer, one of the outmost metal layers has a minimum thickness among the metal layers, and the other metal layers except for the metal layer having the minimum thickness have the same thickness as one another, the same thickness being different from the minimum thickness, and wherein the optical filter has no other repetitive unit film outside the deposition member.

* * * * *